United States Patent
Bowers et al.

(10) Patent No.: US 9,823,287 B2
(45) Date of Patent: Nov. 21, 2017

(54) SYSTEMS AND METHODS FOR RATING SOLAR CELLS

(71) Applicant: Elwha LLC, Bellevue, WA (US)

(72) Inventors: Jeffrey A. Bowers, Bellevue, WA (US); Kenneth G. Caldeira, Redwood City, CA (US); Peter L. Hagelstein, Carlisle, MA (US); Roderick A. Hyde, Redmond, WA (US); Muriel Y. Ishikawa, Livermore, CA (US); Jordin T. Kare, Seattle, WA (US); Nathan P. Myhrvold, Medina, WA (US); Clarence T. Tegreene, Mercer Island, WA (US); Lowell L. Wood, Jr., Bellevue, WA (US); Victoria Y. H. Wood, Livermore, CA (US)

(73) Assignee: Elwha LLC, Bellevue, WA (US)

( * ) Notice: Subject to any disclaimer, the term of this patent is extended or adjusted under 35 U.S.C. 154(b) by 650 days.

(21) Appl. No.: 14/317,598

(22) Filed: Jun. 27, 2014

(65) Prior Publication Data

US 2015/0377952 A1 Dec. 31, 2015

(51) Int. Cl.
*G01R 31/00* (2006.01)

(52) U.S. Cl.
CPC ................... *G01R 31/003* (2013.01)

(58) Field of Classification Search
CPC .................. G01R 31/003; H01L 31/0525
USPC ............................................. 702/2
See application file for complete search history.

(56) References Cited

U.S. PATENT DOCUMENTS

| | | |
|---|---|---|
| 3,247,392 A | 4/1966 | Thelen |
| 5,449,413 A | 9/1995 | Beauchamp et al. |
| 7,081,584 B2 | 7/2006 | Mook |
| 2015/0372640 A1* | 12/2015 | Yang ............... H02S 40/44 136/248 |

* cited by examiner

*Primary Examiner* — Bryan Bui
(74) *Attorney, Agent, or Firm* — Foley & Lardner LLP

(57) ABSTRACT

A method for providing an environmental impact rating for a solar cell includes acquiring power generation data and thermal exchange data regarding the solar cell using a data acquisition device, transmitting the power generation data and the thermal exchange data to a controller, and generating the environmental impact rating based on the power generation data and the thermal exchange data using the controller, wherein the environmental impact rating provides an indication of an environmental impact of using the solar cell.

36 Claims, 5 Drawing Sheets

SYSTEMS AND METHODS FOR RATING SOLAR CELLS

BACKGROUND

Solar cells (e.g., photovoltaic cells) may produce energy without emitting a significant amount of carbon dioxide or other greenhouse gases by converting light (e.g., sunlight) into electricity. However, the positive environmental effects from the use of solar cells may be at least partially offset by other environmental effects associated with their use. For instance, while there are no greenhouse gas emissions associated with generating electricity from solar energy, there may be greenhouse gas emissions associated with other stages of the solar life-cycle, including manufacturing, materials transportation, installation, maintenance, and the like. In addition, solar cells are often low albedo surfaces intended to absorb, rather than reflect, sunlight. Thus, solar cells may produce a net earth-warming effect, particularly when deployed over high albedo surfaces.

SUMMARY

An embodiment of the present disclosure relates to a method for providing an environmental impact rating for a solar cell. The method includes acquiring power generation data and thermal exchange data regarding the solar cell using a data acquisition device, transmitting the power generation data and the thermal exchange data to a controller, and generating the environmental impact rating based on the power generation data and the thermal exchange data using the controller, wherein the environmental impact rating provides an indication of an environmental impact of using the solar cell.

Another embodiment of the present disclosure relates to a system for providing an environmental impact rating for a solar cell. The system includes a data acquisition device configured to acquire power generation data and thermal exchange data regarding the solar cell, and a controller coupled to the data acquisition device and configured to provide the environmental impact rating based on the power generation data and the thermal exchange data, wherein the environmental impact rating provides an indication of an environmental impact of using the solar cell.

Another embodiment of the present disclosure relates to a method for providing solar cell design data for a solar cell. The method includes generating a power generation metric based on a selected power generation criterion, using a controller, wherein the power generation metric is useable to determine a power generation rating for the solar cell, generating a thermal exchange metric based on a selected thermal exchange criterion, using the controller, wherein the thermal exchange metric is useable to determine a thermal exchange rating for the solar cell, generating an environmental impact metric, using the controller, wherein the environmental impact metric is useable to determine an environmental impact rating for the solar cell and the environmental impact rating is based on the power generation rating and the thermal exchange rating, and wherein the environmental impact rating provides an indication of an environmental impact of using the solar cell, and generating solar cell design data, using the controller, based on the environmental impact metric.

Another embodiment of the present disclosure relates to a method for providing an environmental impact rating for a solar cell. The method includes using a controller, generating a power generation rating for the solar cell based on power generation data regarding the solar cell, using the controller, generating a thermal exchange rating for the solar cell based on thermal exchange data regarding the solar cell, and using the controller, generating the environmental impact rating based on the power generation rating and the thermal exchange rating, wherein the environmental impact rating provides an indication of an environmental impact of using the solar cell.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
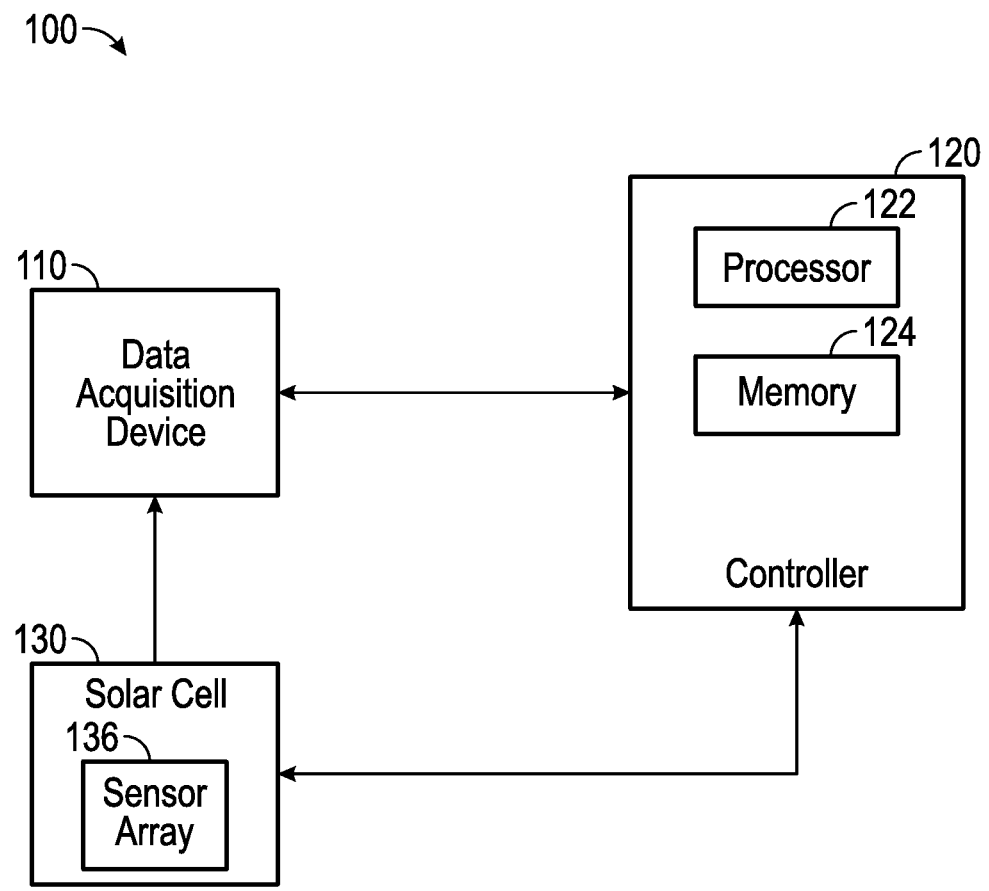
FIG. 1 is a block diagram of a system for providing an environmental impact rating of a solar cell, according to one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the scope of the subject matter presented here.

Referring to FIG. 1, system 100 for providing an environmental impact rating for a solar cell is shown, according to one embodiment. The solar cell may be a photovoltaic cell configured to convert energy from light into electricity by a photovoltaic effect. The environmental impact rating is intended to convey a relative environmental impact of solar cell 130. In one embodiment, the environmental impact rating is intended to provide an indication of the impact of solar cell 130 on global warming. For instance, the environmental impact rating may be based on a carbon footprint of solar cell 130, greenhouse gas emissions associated with solar cell 130, heat absorbed by solar cell 130, and the like. The environmental impact rating may be used for marketing solar cell 130 to a customer as a more efficient or "environmentally-friendly" product. The environmental impact rating may also be used as a dependent variable during a solar cell design process (e.g., initial design, re-design, etc.), such as to improve the efficiency or reduce the environmental impact of solar cell 130. The environmental impact rating is described in further detail below.

System 100 includes data acquisition device 110. Data acquisition device 110 is configured to acquire (e.g., measure, monitor, etc.) data related to a solar cell such as solar cell 130. The data may include an energy efficiency of solar cell 130, one or more dimensions of solar cell 130, or other solar cell data suitable for determining an environmental impact rating for solar cell 130. Data acquisition device 110 may include any number of sensors or other devices or instruments for acquiring the solar cell data, such as a solar radiation sensor or monitor. Data acquisition device 110 may also be configured to acquire solar cell data by receiving data as an input. For instance, data acquisition device 110 may receive data from a user of system 100 based on one or more measurements performed by the user (e.g., via a user interface). Data acquisition device 110 may also be configured to receive independently verified specifications regarding solar cell 130, such as from a manufacturer of solar cell 130 or from a third party. The specifications may be uploaded to data acquisition device 110, such as from a manufacturer website or a solar cell database, received via an electronic signal, or otherwise transmitted to data acquisition device 110.

System 100 also includes controller 120. Data acquisition device 110 is configured to communicate with controller 120, such as to transmit the solar cell data to controller 120. Controller 120 may be physically coupled to data acquisition device 110 or configured to receive the solar cell data remotely (e.g., via a wireless signal). Controller 120 includes processor 122 and memory 124. Processor 122 may be used to perform any functions or processes attributed to controller 120 throughout. Memory 124 may be used to store any data or other information associated with system 100. Controller 120 is configured to determine (e.g., measure, calculate, generate, etc.) the environmental impact rating for solar cell 130 based on the solar cell data. Controller 120 may apply an environmental impact metric to the solar cell data to determine the environmental impact rating. The environmental impact metric is described in further detail in reference to FIG. 2.

Figure 2:
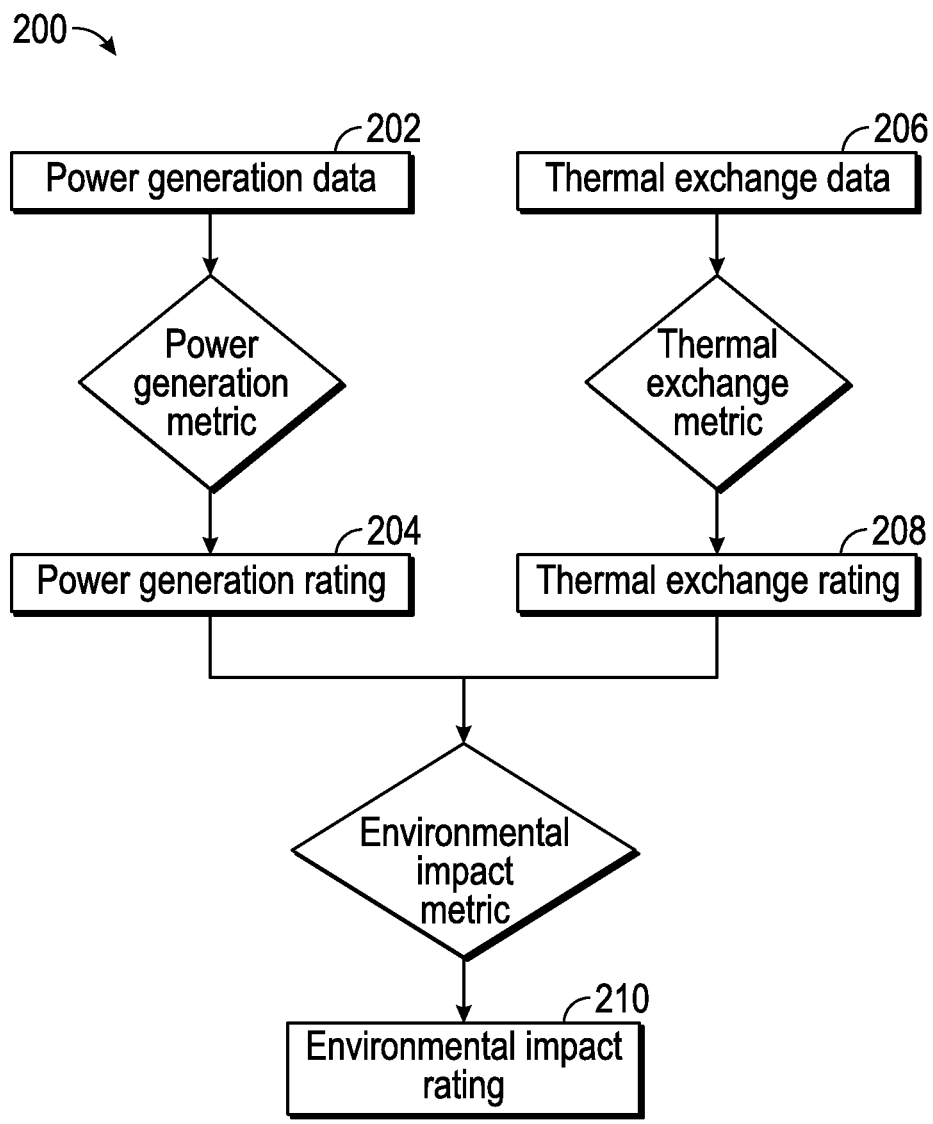
FIG. 2 is a flow chart diagram of a process for determining an environmental impact rating for a solar cell, according to one embodiment.

Referring now to FIG. 2, flow chart 200 shows a process for determining an environmental impact rating for solar cell 130, according to one embodiment. The process may be performed using system 100, including data acquisition device 110 and controller 120. In this embodiment, controller 120 is configured to determine (e.g., generate, provide, calculate, etc.) the environmental impact rating based on power generation data (i.e., data related to a power or energy production or output of solar cell 130) and thermal exchange data (i.e., data related to a heat balance or heat exchange of solar cell 130). The environmental impact rating is intended to balance or compare the energy produced by solar cell 130 (e.g., the amount of energy produced, the energy efficiency, etc.) to any negative environmental effects associated with solar cell 130 (e.g., greenhouse gas emissions, carbon footprint, global warming, etc.). Controller 120 is configured to receive the power generation data and thermal exchange data from data acquisition device 110. For instance, the power generation data and thermal exchange data may be acquired by data acquisition device 110 and transmitted to controller 120 as part of the solar cell data. The data may include measurements of solar cell 130 (e.g., by data acquisition device 110), specifications of solar cell 130 (e.g., provided by a manufacturer, provided by a third party), and/or estimates or calculations of one or more conditions or characteristics based on the measurements and/or specifications.

According to the process shown in FIG. 2, the environmental impact rating is determined by inputting the solar cell data to one or more metrics. Each metric may be or include a measure for quantitatively assessing solar cell 130 (or another energy source) relative to other means of energy production, such as by assigning a number or value to specific attributes of solar cell 130. The numbers or values assigned to each attribute may be combined (e.g., added, multiplied, averaged, etc.) to determine a rating for solar cell 130. The rating is intended to provide a comparison between different solar cells and to other means of energy production. Each metric may be modified or tailored for the specific purpose of the environmental impact rating, such as to place varying weight on certain characteristics or attributes of solar cell 130 depending on importance. For instance, in one embodiment the environmental impact rating is intended to provide an indication of the net effect on global warming for a particular means of energy production (e.g., solar cell 130). In this embodiment, the environmental impact metric (for determining the environmental impact rating) may weight more heavily factors or attributes related to global warming (e.g., heat reflectivity, greenhouse gas emissions, etc.) in order to determine the environmental impact rating. In one embodiment, the metrics used to determine the environmental impact rating are determined or generated by a user of system 100 and inputted to controller 120. In another embodiment, controller 120 is configured to determine one or more metrics (e.g., based on the preferences of a user of system 100). The user of system 100 may be able to modify or adjust one or more metrics to adjust the environmental impact rating (e.g., depending on importance of a particular attribute).

At 202, the power generation data is received. The power generation data may include data regarding an energy efficiency of solar cell 130. For instance, the power generation data may be related to a percentage of solar energy converted to electrical energy by solar cell 130, an energy output per resources used to produce solar cell 130, or another measure of energy efficiency. The power generation data may also include data regarding a power of solar cell 130. For instance, the power generation data may be related to a peak power output of solar cell 130, a power output over a designated time period, a power output per surface area or weight of solar cell 130, or another measure of power production. The power generation data may also include data regarding an energy production of solar cell 130. For instance, the power generation data may be related to an amount of energy produced by solar cell 130 over a period of time or an energy production capability of solar cell 130. In one embodiment, the power generation data is measured or otherwise determined based on standard test conditions (i.e., solar irradiation conditions corresponding to a clear day with sunlight incident upon a sun-facing 37 degree tilted surface with the sun at an angle of 41.81 degrees above the horizon). Other solar irradiation conditions may be adopted when determining power generation data, such as limited spectral ranges (e.g., low frequency or high frequency cutoffs), air masses (e.g., AM0, AM1, AM1.5), or the like.

Still referring to FIG. 2, at 204 a power generation rating is determined (e.g., generated, calculated, provided, etc.) based on the power generation data. The power generation rating may be based on any particular aspect of the power generation data. For instance, a particular importance may be placed on one or more aspects of solar cell 130 depending on the preferences of a user of system 100, and the power generation rating may be weighted in favor of the one or more aspects. In one embodiment, the power generation rating is based on at least one of an energy efficiency, a power production, a solar irradiation, and an energy production of solar cell 130. The power generation rating may be based on a single data point of the power generation data (e.g., a peak power output, a percentage of sunlight converted to electrical energy, etc.), or the power generation rating may be based on or include any number of data points and any number of conditions and/or characteristics of solar cell 130, depending on the particular application of system 100 and/or the preferences of a user of system 100. The power generation rating may be used to compare the power generation capabilities or characteristics of solar cell 130 to another solar cell or to another energy source.

In one embodiment, the power generation rating for solar cell 130 is determined by inputting the power generation data to a metric (i.e., a power generation metric). For instance, controller 120 may be configured to receive the power generation data and generate a power generation rating by applying the power generation metric to the power generation data. The power generation metric is intended to place a relative weight on one or more attributes (e.g., conditions, specifications, etc.) of solar cell 130 in order to produce a single power generation rating for solar cell 130. The power generation rating may be a relative value assigned to solar cell 130 based on comparing the power generation data to similar data or attributes of other solar cells and/or other means of energy production. The power generation metric may also be used to determine a power generation rating for other solar cells, such as to compare the power generation rating of the other solar cells to solar cell 130. In one embodiment, the power generation metric may be used to determine a power generation rating for a non-solar cell means of energy production (e.g., consumption of fossil fuels, nuclear fission, another renewable energy, etc.), such as to compare the power generation rating of another means of energy production to solar cell 130.

Controller 120 may be configured to determine or generate the power generation metric. For instance, controller 120 may be configured to generate the power generation metric based on one or more preferences of a user of system 100. In one embodiment, controller 120 is configured to determine the power generation metric based on at least one of an energy efficiency, a power production, and an energy production. The power generation metric may incorporate attributes of other means of energy production (e.g., other than solar cell 130) in order to compare solar cell 130 to another means of energy production. For instance, the power generation rating of solar cell 130 may be determined relative to one or more other means of energy production. The power generation metric may also incorporate attributes of other solar cells or of an average solar cell, such that the power generation rating provides a rating of the power generation of solar cell 130 relative to other known solar cells.

The power generation metric may incorporate or include an energy efficiency aspect. In one embodiment, solar cell 130 is assigned an energy efficiency value or rating based on the power generation data and the energy efficiency value may be incorporated into the power generation rating. For instance, the power generation data may include an energy efficiency value for solar cell 130, or controller 120 may be configured to determine an energy efficiency value for solar cell 130 based on the power generation data. In another embodiment, power generation data related to the energy efficiency of solar cell 130 is considered and incorporated as part of the power generation rating. The energy efficiency aspect of the power generation metric may include a relative comparison to other solar cells or other means of energy production. The energy efficiency aspect may also include an absolute value or rating for solar cell 130 that is determined independently of other solar cells and/or other means of energy production.

The power generation data sent to controller 120 may correspond to the power generation metric. For instance, data acquisition device 110 may be configured to send only the power generation data that is necessary for generating the power generation rating (e.g., considered by the power generation metric). In one embodiment, controller 120 is configured to receive the power generation data and request any additional data from data acquisition device 110 that is required for determining the power generation rating (e.g., based on the power generation metric). In another embodiment, controller 120 is configured to estimate or otherwise determine any other data or information not included within the power generation data that is required for determining the power generation rating. In one embodiment, controller 120 is configured to request the missing data from data acquisition device 110, then estimate any unavailable data that is required to determine the power generation rating.

In one embodiment, the power generation metric incorporates an energy conversion (e.g., a capability for converting energy) of the selected means of energy production (e.g., solar cell 130). In one embodiment, the power generation rating for solar cell 130 is based on an energy conversion coefficient of solar cell 130. The energy conversion coefficient of solar cell 130 may represent a percentage of solar energy to which solar cell 130 is exposed that is converted into electrical energy. In one embodiment, the solar cell data (e.g., the power generation data) includes the energy conversion coefficient. For instance, data acquisition device 110 may be configured to determine the energy conversion coefficient of solar cell 130 and send the energy conversion coefficient to controller 120 as part of the solar cell data. In another embodiment, the energy conversion coefficient may be provided as a product specification by a manufacturer or third party. The energy conversion coefficient may also be determined (e.g., calculated, generated, etc.) by controller 120 based on the solar cell data (e.g., the power generation data). For instance, the power generation data may include a maximum power output of solar cell 130, a light input for solar cell 130 (e.g., amount of sunlight received), and a surface area of solar cell 130, and controller 120 may determine the energy conversion coefficient by dividing the maximum power output by the light input and the surface area of solar cell 130.

In one embodiment, the power generation rating incorporates or is based on at least one of a reflectance efficiency, a thermodynamic efficiency, a charge carrier separation efficiency, and a conduction efficiency of the selected means of energy production (e.g., solar cell 130). For instance, the power generation metric may be configured to calculate the power generation rating based on at least one of the reflectance efficiency, the thermodynamic efficiency, the charge carrier separation efficiency, and the conduction efficiency of solar cell 130. The reflectance efficiency, thermodynamic efficiency, charge carrier separation efficiency, and conduction efficiency are related to the energy efficiency of the means of energy production.

The power generation data sent to controller 120 may include at least one of a reflectance efficiency, a thermodynamic efficiency, a charge carrier separation efficiency, and a conduction efficiency for solar cell 130. The power generation metric may be applied to the data to determine the power generation rating. Controller 120 may be configured to determine an energy efficiency value or rating of solar cell 130 based on at least one of a reflectance efficiency, a thermodynamic efficiency, a charge carrier separation efficiency, and a conduction efficiency of solar cell 130. The power generation data may include values for each of the reflectance efficiency, the thermodynamic efficiency, the charge carrier separation efficiency, and the conduction efficiency of solar cell 130. The power generation data may also include other solar cell data that may be used to determine one or more of the efficiency values. For instance, controller 120 may be configured to determine one or more of the efficiency values based on the power generation data and/or other solar cell data.

The reflectance efficiency of solar cell 130 is related to the reflectivity of solar cell 130 and may be based on a percentage of light that is reflected from a surface of solar cell 130. The reflectance efficiency is based on a reflection coefficient for solar cell 130. In one embodiment, the power generation data includes the reflection coefficient and controller 120 is configured to determine the reflectance efficiency of solar cell 130 based on the reflection coefficient. The reflection coefficient may be based on a percentage of light reflected from the surface of solar cell 130 and an angle of incidence at which the light strikes the surface. In one embodiment, the percentage of light and the angle of incidence are included as part of the power generation data and controller 120 is configured to determine the reflection coefficient based on the data.

The thermodynamic efficiency of solar cell 130 may be expressed as a percentage of sunlight reaching solar cell 130 that is converted into electricity (i.e., a conversion efficiency of solar cell 130). The thermodynamic efficiency may also be expressed as a ratio between the useful output of solar cell 130 (e.g., energy or electricity) and the input. For the purposes of thermodynamic efficiency, the input is the amount of heat received by solar cell 130, or the heat content of the sunlight received by solar cell 130. In one embodiment, the power generation data includes an amount of sunlight received by solar cell 130, an amount of heat received by solar cell 130, and/or an amount of electricity produced by solar cell 130 over a period of time, and controller 120 is configured to determine the thermodynamic efficiency of solar cell 130 based on the power generation data.

The charge carrier separation efficiency of solar cell 130 is related to a separation of charge carriers (i.e., particles such as electrons and holes carrying electric charges) within solar cell 130. The charge carrier separation efficiency may be determined based on a drift of the charge carriers, a diffusion of the charge carriers, and/or the presence of an electric field within solar cell 130. In one embodiment, the power generation data includes at least one of a number of mobile charge carriers within solar cell 130, a diffusion length of the charge carriers within solar cell 130, and a thickness of solar cell 130. In this embodiment, controller 120 is configured to determine the charge carrier separation efficiency based on the power generation data.

The conduction efficiency of solar cell 130 is related to a transfer of heat energy within solar cell 130 by collisions of particles (e.g., electrons) due to a temperature change (e.g., caused by direct sunlight). The conduction efficiency may be expressed as a percentage of heat energy from sunlight reaching solar cell 130 that is converted into electricity. In one embodiment, the power generation data includes at least one of an amount of heat received by solar cell 130, an amount of sunlight received by solar cell 130, an amount of electricity produced by solar cell 130, an amount of heat absorbed by solar cell 130, and a thermal conductivity of solar cell 130. In this embodiment, controller 120 is configured to determine the conduction efficiency of solar cell 130 based on the power generation data.

In one embodiment, the power generation rating incorporates or is based on at least one of a quantum efficiency, an open-circuit voltage ratio, and a fill factor of the selected means of energy production (e.g., solar cell 130). For instance, the power generation metric may be configured to calculate the power generation rating based on at least one of the quantum efficiency, the open-circuit voltage ratio, and the fill factor of solar cell 130. The quantum efficiency, open-circuit voltage ratio, and fill factor are related to the energy efficiency of the means of energy production.

In one embodiment, the power generation data includes at least one of a quantum efficiency, an open-circuit voltage ratio, and a fill factor for solar cell 130. In this embodiment, controller 120 may be configured to determine an energy efficiency value for solar cell 130 based on at least one of the quantum efficiency, open-circuit voltage ratio, and fill factor of solar cell 130. The power generation data may include values for each of the quantum efficiency, the open-circuit voltage ratio, and the fill factor of solar cell 130. The power generation data may also include other solar cell data that may be used to determine one or more of the efficiency values. For instance, controller 120 may be configured to determine one or more of the efficiency values based on the power generation data and/or other solar cell data.

The quantum efficiency of solar cell 130 refers to a percentage of photons reaching a photo-reactive surface of solar cell 130 that produce charge carriers. In particular, the quantum efficiency of solar cell 130 indicates an amount of electrical current that solar cell 130 will produce when irradiated by photons of a particular wavelength. The quantum efficiency may be expressed as a spectral measurement (e.g., as a function of photon wavelength or energy) and may be measured in electrons per photon or amps per watt. An integrated quantum efficiency can be used in which a spectral quantum efficiency is weighted by a solar spectrum and integrated over a range of photon frequencies. The quantum efficiency of solar cell 130 may include an external quantum efficiency of solar cell 130, which includes the effect of optical losses from solar cell 130, such as by transmitting or reflecting light. In one embodiment, controller 120 is configured to determine the quantum efficiency of solar cell 130 based on the power generation data, which may include a photon wavelength, a photon energy, an external quantum efficiency, an internal quantum efficiency, a reflectance, a light absorption, and/or other data relevant to the quantum efficiency of solar cell 130.

The open-circuit voltage ratio of solar cell 130 refers to a difference of electrical potential between two terminals of solar cell 130 when disconnected from any circuit. The open-circuit voltage ratio of solar cell 130 may be based on an open-circuit voltage of solar cell 130, which is the maximum voltage available from solar cell 130. The open-circuit voltage ratio may compare an actual voltage produced by solar cell 130 to the open-circuit voltage. In one embodiment, the power generation data includes at least one of a saturation current, a light-generated current, a charge carrier concentration, a thermal voltage, a doping concentration, and a temperature of solar cell 130, and controller 120 is configured to determine the open-circuit voltage ratio of solar cell 130 based on the power generation data. The power generation data may also include any other data required for determining the open-circuit voltage ratio in this embodiment.

The fill factor of solar cell 130 may be used to determine a maximum power of solar cell 130. The fill factor of solar cell 130 refers to a maximum power of solar cell 130 divided by an open-circuit voltage and short circuit current of solar cell 130. The short circuit current of solar cell 130 refers to a current through solar cell 130 when the voltage across solar cell 130 is zero. In one embodiment, controller 120 is configured to determine the fill factor of solar cell 130 based on the power generation data, which may include the maximum power, open-circuit voltage, and short circuit current of solar cell 130. The power generation data may also include other data related to solar cell 130 and relevant to determining the fill factor of solar cell 130.

Still referring to FIG. 2, the power generation metric for determining the power generation rating at 204 may incorporate or include an energy production aspect intended to evaluate the energy production of a particular energy-producing device or means. For instance, the power generation rating may include an energy production value or rating that may be determined by applying the power generation metric to the power generation data. In one embodiment, the power generation data includes data related to the energy production of solar cell 130. For instance, the power generation data may include an amount of electrical energy produced by solar cell 130, an amount of energy transferred by solar cell 130, an amount of heat energy or sunlight received by solar cell 130, an amount of potential energy stored within solar cell 130, an amount of kinetic energy produced by solar cell 130, or other data related to the energy production of solar cell 130. The data may be based on a total energy production or an energy production over a designated period of time. The power generation data may also include one or more dimensions of solar cell 130, such as to determine the energy production value based on the dimensions of solar cell 130 (i.e., relative to a size of solar cell 130). The energy production value for solar cell 130 may be included as part of the power generation data received by controller 120, or controller 120 may be configured to determine an energy production value for solar cell 130 based on the power generation data. The energy production value may be or include a relative comparison to other solar cells or other means of energy production. The energy production value may also be or include an absolute value or rating for solar cell 130 that is determined independently of other solar cells and/or other means of energy production.

In another embodiment, the power generation metric is applied directly to the power generation data (e.g., data related to the energy production of solar cell 130) to determine the power generation rating. The power generation metric may include one or more characteristics or attributes related to energy production or to power production, such as those described above in reference to the power generation data. In one embodiment, data acquisition device 110 is configured to send data related to the energy production or power production of solar cell 130 and corresponding to the power generation metric. In this embodiment, controller 120 is configured to receive the data and may be configured to determine any further data required to determine the energy production value, power production value, and/or the power generation rating. Controller 120 may request additional data from data acquisition device 110 and/or estimate any other required data in order to determine the energy production value and/or the power generation rating.

The power generation data may include a maximum theoretical energy output of solar cell 130, such as from the manufacturer. The power generation data may also include physical characteristics of solar cell 130, such as data related to a dimension, material composition, size, weight, color, and shape of solar cell 130, and controller 120 may be configured to estimate an energy production of solar cell 130 based on the physical characteristics. The power generation data may also include one or more environmental conditions associated with the power generation data and the energy production value may be determined based on the environmental conditions. The power generation data may also include any other information related to the energy production of solar cell 130, including data measured by data acquisition device 110, data received from a manufacturer or third party, and data estimated based on one or more measurements or inputs related to solar cell 130. In one embodiment, the energy production value, power production value, and/or power generation rating is determined based on specific characteristics of solar cell 130. For instance, the power production of solar cell 130 (or another means of energy production) may be determined relative to a surface area, volume, or mass of solar cell 130 in order to weight the relative costs (e.g., materials cost, manufacturing cost, installation cost, etc.) of solar cell 130 against its energy production. In this embodiment, the power generation data may include dimensions of solar cell 130 for determining an energy production or power production relative to the size of solar cell 130. The power generation metric may be based on any of the above-referenced attributes.

Still referring to FIG. 2, the power generation metric for determining the power generation rating at 204 may incorporate or include a power production aspect intended to evaluate the power production (e.g., an electrical output or generation) of a particular power-producing device or means. In one embodiment, solar cell 130 is assigned a power production value or rating. The power production value may be based on the power generation data, which may include data related to the power production of solar cell 130. The power production value may be determined by applying the power generation metric to the power generation data. For instance, the power generation data may include a peak power production of solar cell 130, an average power production of solar cell 130 over a designated period of time, and/or other data related to the power production of solar cell 130. The power generation data may also include one or more dimensions of solar cell 130, such as to determine the power production value based on the dimensions of solar cell 130 (i.e., relative to a size of solar cell 130). Controller 120 may be configured to determine a power production value for solar cell 130 based on the power generation data (e.g., by applying the power generation metric). The power production value for solar cell 130 may also be included as part of the power generation data received by controller 120. The power production value may be or include a relative comparison to other solar cells or other means of energy production. The power production value may also be or include an absolute value or rating for solar cell 130 that is determined independently of other solar cells and/or other means of energy production.

The power generation rating may also be determined by applying the power generation metric directly to the power generation data (e.g., data related to the energy production of solar cell 130). The power generation metric may include one or more attributes or characteristics related to power production, such as those described above in reference to the power generation data. In one embodiment, data acquisition device 110 is configured to send data related to the power production of solar cell 130 and corresponding to the power generation metric to controller 120. In this embodiment, controller 120 is configured to receive data and may be configured to determine any further data required to determine the power production value and/or the power generation rating. Controller 120 may request additional data from data acquisition device 110 and/or estimate any other required data in order to determine the power production value and/or the power generation rating.

In one embodiment, the power generation data includes data related to the peak power output of solar cell 130 and/or the average power output of solar cell 130 over time. In this embodiment, controller 120 may be configured to determine a peak power output and/or an average power output for solar cell 130 and incorporate the values into the power generation rating. For instance, controller 120 may determine the peak power output and/or the average power output for solar cell 130 by applying the power generation metric to the power generation data. The power generation data may include a maximum theoretical power output of solar cell 130, such as from the manufacturer. The power generation data may include physical characteristics of solar cell 130, such as data related to a dimension, material composition, size, weight, color, or shape of solar cell 130, and controller 120 may be configured to estimate a power production of solar cell 130 based on the physical characteristics. The power generation data may also include one or more environmental conditions associated with the power generation data and the power production rating may be determined based on the environmental conditions. The power generation data may also include any other information related to a peak or average power output of solar cell 130, including data measured by data acquisition device 110, data received from a manufacturer or third party, and data estimated based on one or more measurements or inputs related to solar cell 130. Any of the above attributes or characteristics may also be used to determine the power generation rating (e.g., may be inputs received as part of the power generation metric).

In one embodiment, the power production rating is determined based on specific dimensions of solar cell 130. For instance, the power production of solar cell 130 (or another means of energy production) may be determined relative to a surface area, volume, or mass of solar cell 130 in order to weight the relative costs (e.g., materials cost, manufacturing cost, installation cost, etc.) of solar cell 130 against its power production.

The power generation metric may be based on one or more manufacturing costs of solar cell 130. For instance, the power generation metric may incorporate data related to other solar cells or alternative means of energy production and include a relative comparison of the manufacturing costs to the other means of energy production. The alternative means of energy production may include consumption of fossil fuels (e.g., coal, petroleum, natural gas, etc.), nuclear fission, and production of renewable energy (e.g., biofuel, biomass, geothermal heat, hydroelectricity, tidal power, wave power, wind power, etc.). The manufacturing costs for solar cell 130 may include an environmental cost associated with fossil fuel consumption, greenhouse gas emissions, other waste-related costs, as well as a financial cost. The power generation metric may compare these costs to those of other means of energy production and incorporate the comparison into the power generation rating. For instance, the power generation metric may be generated or determined by comparing a carbon dioxide emission or a total carbon consumption of two or more means of energy production. In one embodiment, the power generation data includes at least one of a fossil fuel consumption, a greenhouse gas emission, a waste-related cost, and a financial cost of manufacturing solar cell 130. The costs may also be included for a lifetime of solar cell 130, including any costs associated with maintenance and disposal. Likewise, these costs may be incorporated into the power generation metric and used to determine the power generation rating.

Referring still to FIG. 2, at 206 thermal exchange data is received. The thermal exchange data may include data regarding a heat transfer or thermal exchange at solar cell 130. For instance, as solar cell 130 converts sunlight into power or electrical energy, heat energy may be absorbed and stored by solar cell 130, rather than reflected or transferred. The thermal exchange data may be related to or include an amount or percentage of heat energy absorbed or stored by solar cell 130, an amount or percentage of heat energy reflected or transferred from solar cell 130, a thermal radiation of solar cell 130, an albedo (e.g., a reflectivity) of solar cell 130, a reflection coefficient of solar cell 130, an emissivity coefficient of solar cell 130, a temperature of solar cell 130, or another measure of heat transfer or thermal efficiency. The thermal exchange data may be based on a total amount of heat energy transferred or absorbed by solar cell 130, or a rate at which heat energy is transferred or absorbed. The thermal exchange data may be based on a comparison of thermal exchange data for solar cell 130 with corresponding thermal exchange data for a surface occluded by the solar cell (i.e., the thermal exchange data which would pertain if solar cell 130 was not present). Thermal exchange data for the occluded surface may comprise an albedo, a thermal emissivity, a thermal radiation, a temperature, a heat capacity, thermal diffusion, or the like. In one embodiment, the thermal exchange data is measured or otherwise determined based on standard test conditions (e.g., values of solar irradiation, solar cell temperature, a designated time interval, etc.), which may be similar or different from the test conditions used to measure the power generation data.

At 208, a thermal exchange rating for solar cell 130 is determined (e.g., generated, calculated, provided, etc.) based on the thermal exchange data. The thermal exchange rating is intended to provide an indication of the amount of heat absorbed by solar cell 130 as solar cell 130 converts sunlight to electrical energy. The thermal exchange rating may be based on an albedo or reflectiveness of solar cell 130, a thermal efficiency of solar cell 130, a relative size of solar cell 130, a thermal emissivity of solar cell 130, a thermal radiation of solar cell 130, a temperature of solar cell 130, or any other factors that may affect how heat energy is transferred, reflected, or exchanged within solar cell 130. The thermal exchange rating may be based on a comparison of thermal exchange data for solar cell 130 with corresponding thermal exchange data for a surface occluded by the solar cell. The thermal exchange rating may be based on any particular aspect of the thermal exchange data. For instance, a particular importance may be placed on one or more aspects of solar cell 130 depending on the preferences of a user of system 100, and the thermal exchange rating may be weighted in favor of the one or more aspects. In one embodiment, the thermal exchange rating is based on a heat transfer of solar cell 130. The thermal exchange rating may be based on a single data point of the thermal exchange data (e.g., an average ratio of heat absorbed, an albedo of solar cell 130, a thermal radiation, etc.), or the thermal exchange rating may be based on or include any number of data points and any number of conditions and/or characteristics of solar cell 130, depending on the particular application of system 100 and/or the preferences of a user of system 100. The thermal exchange rating may be used to compare the thermal exchange capabilities or characteristics of solar cell 130 to another solar cell or to another device or means of energy production. In one embodiment, the thermal exchange rating is determined based on standard test conditions, which may be similar or different from the test conditions used to determine the power generation rating.

In one embodiment, the thermal exchange rating for solar cell 130 is determined by applying a metric (i.e., the thermal exchange metric) to the thermal exchange data. For instance, controller 120 may be configured to receive the thermal exchange data and generate a thermal exchange rating by applying the thermal exchange metric to the thermal exchange data. The thermal exchange metric is intended to place a relative weight on one or more conditions or specifications of solar cell 130 in order to produce a single thermal exchange rating for solar cell 130. The thermal exchange metric may also be used to determine a thermal exchange rating for other solar cells, such as to compare the heat transfer or thermal exchange characteristics of the other solar cells to solar cell 130. In one embodiment, the thermal exchange metric may be used to determine a thermal exchange rating for a non-solar cell means of energy production (e.g., consumption of fossil fuels, nuclear fission, another renewable energy, etc.), such as to compare the heat transfer or thermal exchange characteristics of another means of energy production to solar cell 130.

Controller 120 may be configured to determine or generate the thermal exchange metric. For instance, controller 120 may be configured to generate the thermal exchange metric based on one or more preferences of a user of system 100. In one embodiment, controller 120 is configured to determine the thermal exchange metric based on characteristics or conditions such as those described above in relation to the thermal exchange data. For instance, the thermal exchange metric may be used to assess a heat absorption, heat reflection, thermal radiation, thermal emissivity, temperature, surface albedo, and/or a reflection coefficient of a particular means of energy production in order to provide the thermal exchange rating. The thermal exchange metric may incorporate data related to other means of energy production (e.g., other than solar cell 130) in order to provide a thermal exchange rating for solar cell 130 relative to other solar cells or other means of energy production. For instance, the thermal exchange rating of solar cell 130 may be determined relative to one or more other means of energy production. The thermal exchange metric may be based on a comparison of thermal exchange data for solar cell 130 with corresponding thermal exchange data for a surface occluded by solar cell 130. In one embodiment, the thermal exchange metric is based on a difference between the net warming (e.g., difference between solar irradiation absorbed and heat lost by thermal radiation) of solar cell 130 and the net warming of a surface occluded by solar cell 130. The thermal exchange metric may also incorporate data regarding other solar cells or an average solar cell, such that the thermal exchange rating provides a rating of the heat transfer or thermal exchange at solar cell 130 relative to other known solar cells.

In one embodiment, the thermal exchange rating for solar cell 130 is based on a heat transfer coefficient (e.g., heat transfer coefficient is an input for the thermal exchange metric). The heat transfer coefficient of solar cell 130 relates to a heat transfer rate of solar cell 130. Solar cell 130 may be assigned a heat transfer coefficient value or rating based on the thermal exchange data (e.g., by applying the thermal exchange metric to the thermal exchange data). The heat transfer coefficient value may be incorporated into the thermal exchange rating. For instance, the thermal exchange data may include a heat transfer coefficient value for solar cell 130, or controller 120 may be configured to determine a heat transfer coefficient value for solar cell 130 based on the thermal exchange data. In another embodiment, thermal exchange data related to the heat transfer efficiency of solar cell 130 is considered and incorporated as part of the thermal exchange rating. The heat transfer efficiency aspect of the power generation metric may include a relative comparison to other solar cells or other means of energy production. The heat transfer efficiency aspect may also include an absolute value or rating for solar cell 130 that is determined independently of other solar cells and/or other means of energy production.

The heat transfer coefficient of solar cell 130 may be used to determine the thermal exchange rating. The heat transfer coefficient of solar cell 130 may be included as part of the thermal exchange data. In one embodiment, controller 120 is configured to determine the heat transfer coefficient of solar cell 130 based on the thermal exchange data. The heat transfer coefficient may be determined based on and the thermal exchange data may include at least one of an amount of heat absorbed by solar cell 130, an amount of heat reflected by solar cell 130, and a thermal radiation emitted by solar cell 130 over a designated period of time. The thermal radiation emitted by solar cell 130 may be determined by a relation (e.g., the Stefan-Boltzmann Law) combining the temperature of solar cell 130 and an emissivity coefficient of solar cell 130. In some embodiments the emissivity may be directionally dependent, thereby affecting the escape of thermal radiation from the atmosphere. The heat transfer coefficient may also be determined and the thermal exchange data may include at least one of an albedo of solar cell 130, a reflection coefficient of solar cell 130, and a directional reflectivity of solar cell 130. In one embodiment, solar cell 130 includes a spectrally-dependent coating configured to reflect light and controller 120 is configured to determine the heat transfer coefficient based on one or more reflective properties of the spectrally-dependent coating.

The thermal exchange rating may be determined by applying the thermal exchange metric directly to the thermal exchange data. For instance, the thermal exchange data may include data measured by data acquisition device 110, data from a manufacturer or third party, or data estimated by controller 120. The thermal exchange data (e.g., data sent by data acquisition device 110) may be based on the data required by the thermal exchange metric. The thermal exchange rating may be used to determine relative heat transfer or thermal exchange attributes of solar cell 130 (or another device or means of energy production), such as to determine the environmental impact rating of solar cell 130 (or the other means of energy production).

In some embodiments, solar cell 130 may include a solar concentrator, so that the solar irradiation reaching solar cell 130 first passes through the solar concentrator; generally, the surface area of the solar concentrator is larger than that of solar cell 130. In such embodiments, solar cell 130 can be treated as a system along with the solar concentrator, and properties of the solar concentrator (e.g., reflectivity, emissivity, area, transmission, etc.) straightforwardly affect the power generation data and the thermal exchange data, as well as their ratings and metrics.

Referring still to FIG. 2, at 210 the environmental impact rating is determined. The environmental impact rating is based on the solar cell data. In one embodiment, the environmental impact rating is determined by applying a metric (e.g., the environmental impact metric) to the solar cell data. For instance, the environmental impact metric may be applied (e.g., by controller 120) directly to the power generation data, the thermal exchange data, and/or any other solar cell data (e.g., data received from data acquisition device 110) to determine the environmental impact rating. In one embodiment, controller 120 is configured to generate or determine the environmental impact metric. The environmental impact metric may include an algorithm or system for determining a relative environmental impact of solar cell 130 or another device or means of energy production.

In one embodiment, the environmental impact rating is determined based on the power generation rating and the thermal exchange rating. For instance, the environmental impact rating may be determined by applying the environmental impact metric to the power generation rating and the thermal exchange rating (e.g., applying the environmental impact metric to the power generation data and the thermal exchange data). In one embodiment, the environmental impact rating may be based on a sum or product of the thermal exchange rating and the power generation rating. The environmental impact metric may place particular weight on the power generation rating or the thermal exchange rating, including any aspect of either rating, such as the power generation data or the thermal exchange data. The environmental impact metric may also place particular weight on another aspect of the means of energy production, including any data received from data acquisition device 110.

The environmental impact rating is intended to provide an indication of a relative and/or total environmental impact of solar cell 130, as described above. In one embodiment, controller 120 is configured to determine the environmental impact rating. For instance, the environmental impact rating may be weighted in favor of any single factor or characteristic of solar cell 130, or groups of factors or characteristics, depending on the environmental impact metric (e.g., by adjusting the environmental impact metric or another metric). A user of system 100 may adjust one or more aspects of the environmental impact metric, the power generation metric, and/or the thermal exchange metric in order to change the information expressed by the environmental impact rating. The user may determine the relative weight placed on each aspect or attribute used to determine the environmental impact rating, such as by selecting an aspect or attribute of particular importance. The thermal exchange data, the power generation data, and/or other solar cell data may also be adjusted, weighted, controlled, or otherwise manipulated by a user of system 100 in order to produce a desired result (i.e., convey the intended information).

In one embodiment, the environmental impact metric is adjusted or controlled such that the environmental impact rating provides an indication of an overall efficiency of a selected means of energy production (e.g., solar cell 130), including an energy efficiency, a materials efficiency, or a cost efficiency of the means of energy production. In one embodiment, the environmental impact rating includes an absolute value or rating that may be compared to other types of energy production (e.g., an environmental impact rating for solar cell 130 may be meaningfully compared to an environmental impact rating for a generator). The environmental impact rating may also include a value relative to other similar means of energy production (e.g., an environmental impact rating for solar cell 130 is comparable to other the environmental impact rating of other solar cells). In one embodiment, the environmental impact rating is based on an intended location for solar cell 130. In this embodiment, the environmental impact metric may be used to interpret (e.g., be applied to) one or more environmental conditions, such as a latitude, a cloud cover, an orientation, or an average temperature of the intended location. For instance, the environmental impact rating for solar cell 130 may vary depending on one of the environmental conditions. The environmental conditions may also include an albedo or emissivity of the surrounding surface of the intended location, for instance that of a surface occluded by solar cell 130.

In one embodiment, the environmental impact rating provides an indication of a net effect of solar cell 130 on global warming. For instance, the environmental impact rating may indicate how much global warming (e.g., heat absorbed minus thermal radiation, $CO_2$ released during its manufacture, etc.) is caused by solar cell 130 compared to its energy production (e.g., on average and/or over the life cycle of solar cell 130), or any other factors or conditions related to global warming, such as those described above (e.g., global warming for a specified amount of produced energy). For instance, the environmental impact rating may indicate how much energy is produced by solar cell 130 compared to its induced amount of global warming, e.g., energy produced for a specified amount of global warming. In determining the global warming induced by solar cell 130 or in comparing its global warming to that of other energy producing devices, we may employ conversion factors to relate direct warming to indirect warming (e.g., future warming due to $CO_2$, methane, etc.).

In one embodiment, controller 120 is configured to determine solar cell design data based on the environmental impact rating, the thermal exchange rating, the power generation rating, the thermal exchange data, and/or the power generation data. For instance, controller 120 may be configured to determine one or more design changes for solar cell 130 in order to improve the environmental impact rating. In one embodiment, the environmental impact metric may be applied to the solar cell design data to determine an estimated environmental impact of a potential solar cell design. The solar cell design may then be adjusted to adjust the estimated environmental impact. The solar cell design data may be used in an initial design of solar cell 130 or to re-design solar cell 130.

Figure 3:
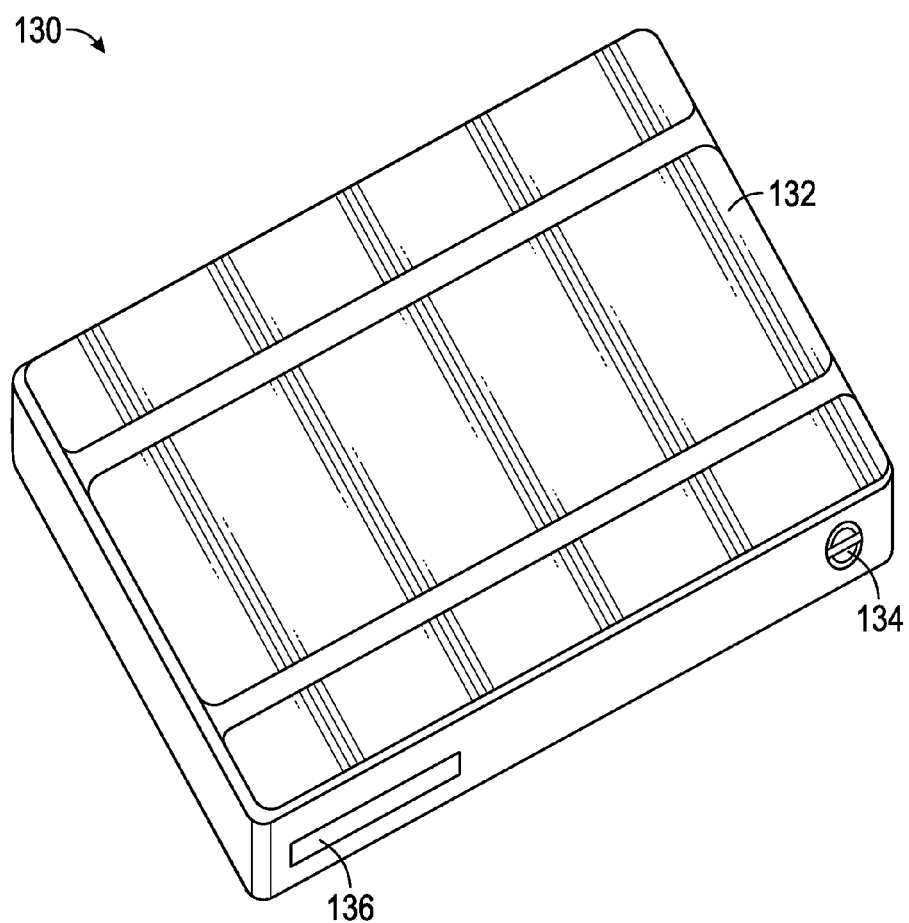
FIG. 3 is an illustration of a solar cell, according to one embodiment.

Referring now to FIG. 3, solar cell 130 is shown according to one embodiment. In this embodiment, solar cell 130 includes surface 132. Surface 132 is intended to absorb and reflect sunlight in order to convert the sunlight to electrical energy. Surface 132 has an albedo or reflectivity, which may affect at least the energy efficiency and heat transfer coefficient of solar cell 130. In one embodiment, surface 132 includes a spectrally-dependent coating configured to reflect light and the coating may contribute to the albedo of solar cell 130. The environmental impact rating of solar cell 130 may be based on one or more dimensions or other physical characteristics of solar cell 130, such as a surface area or volume of solar cell 130. In this embodiment, solar cell 130 includes an indication or certification 134 based on the environmental impact rating. Certification 134 is intended to provide a visual indication of the environmental impact rating, such as for a purchaser or user of solar cell 130. Certification 134 may be located on solar cell 130, such as by a stamp or sticker, may be a scannable optical image, or may be an electronically readable RFID tag, for determining the environmental impact rating.

Solar cell 130 also includes sensor assembly 136 in this embodiment. Sensor assembly 136 is configured to monitor solar cell 130. Sensor assembly 136 is configured to collect data related to solar cell 130 in order to determine an actual environmental impact rating for solar cell 130. The data may be used to validate the environmental impact rating, including any data or ratings used to determine the environmental impact rating. In one embodiment, certification 134 is modifiable and sensor assembly 136 is configured to modify certification 134 based on the data collected. For instance, certification 134 may include a scannable optical image and sensor assembly 136 may be configured to modify the output (e.g., the optical image) to reflect an accurate environmental impact rating based on data collected during use of solar cell 130. In one embodiment, sensor assembly 136 is configured to communicate with controller 120 in order to send data to controller 120. Controller 120 may be similarly configured to modify certification 134 based on the data received from sensor assembly 136.

Figure 4:
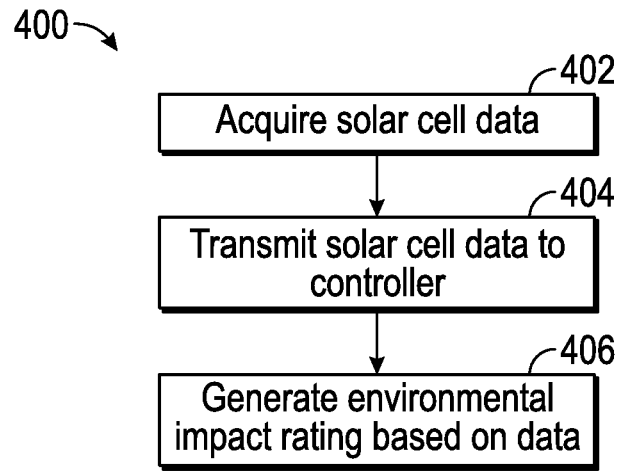
FIG. 4 is a flow chart diagram of a process for determining an environmental impact rating for a solar cell, according to one embodiment.

Referring now to FIG. 4, flow chart 400 shows a process for determining an environmental impact rating for a solar cell (e.g., solar cell 130), according to one embodiment. At 402, solar cell data (i.e., data related to solar cell 130) is acquired (e.g., using data acquisition device 110). The solar cell data may be acquired by monitoring solar cell 130, receiving specifications from a manufacturer or third party, uploading the solar cell data from a database, or by otherwise acquiring the data. The solar cell data may include power generation data, thermal exchange data, or other data related to an environmental impact of solar cell 130. At 404, the solar cell data is transmitted (e.g., to controller 120). Controller 120 may be coupled to data acquisition device 110 or the solar cell data may be transmitted remotely. In one embodiment, controller 120 requests any necessary data for determining the environmental impact rating and data acquisition device 110 sends the requested data. In another embodiment, data acquisition device 110 sends all acquired data and controller 120 determines the necessary data from the data received. At 406, an environmental impact rating is generated (e.g., by controller 120) based on the solar cell data (e.g., the power generation data and the thermal exchange data). The environmental impact rating may be generated by applying an environmental impact metric to the solar cell data. In one embodiment, a power generation rating is generated (e.g., by controller 120) based on power generation data from data acquisition device 110 and a thermal exchange rating is generated (e.g., by controller 120) based on thermal exchange data from data acquisition device 110. In this embodiment, the environmental impact rating may be generated based on the power generation rating and the thermal exchange rating.

Figure 5:
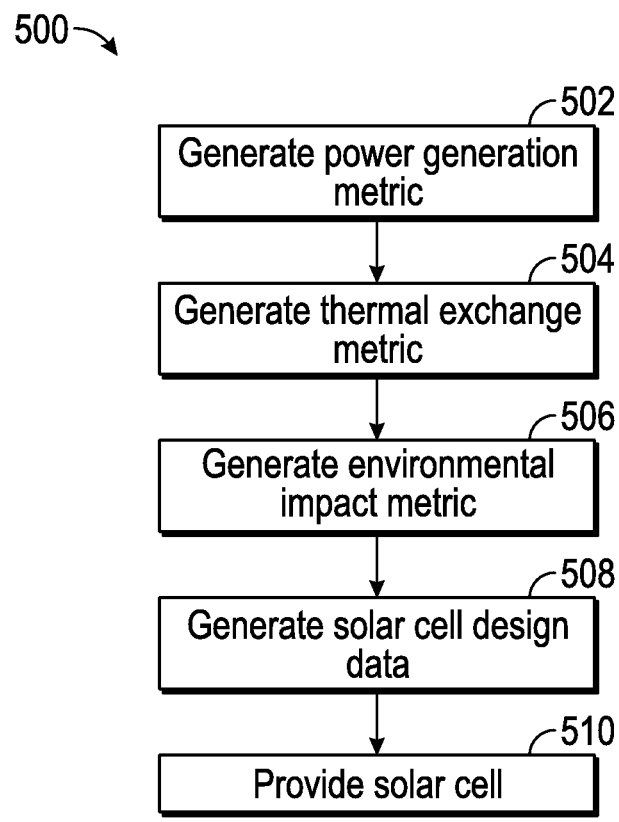
FIG. 5 is a flow chart diagram of a process for providing a solar cell, according to one embodiment.

Referring now to FIG. 5, flow chart 500 shows a process for providing solar cell design data for a solar cell (e.g., solar cell 130), according to one embodiment. The process may be at least partially performed using controller 120. At 502, a power generation metric is generated based on a selected power generation criterion (e.g., using controller 120). The power generation criterion may include any data or parameters described above and related to a means of energy production. The power generation criterion may also include other parameters or data related to power generation associated with a means of energy production. The power generation metric is useable to determine a power generation rating for solar cell 130. The power generation metric may be used to quantitatively assess a power generation capability of solar cell 130. The power generation metric may be applied to data regarding the solar cell to determine the power generation rating.

At 504, a thermal exchange metric is generated based on a selected thermal exchange criterion (e.g., using controller 120). The thermal exchange criterion may include any data or parameters described above and related to a means of energy production. The thermal exchange criterion may also include other parameters or data related to thermal or heat exchange associated with a means of energy production. The thermal exchange metric is useable to determine a thermal exchange rating for solar cell 130. The thermal exchange metric may be used to quantitatively assess a thermal exchange (e.g., heat energy exchange) capability of solar cell 130. The thermal exchange metric may be applied to data regarding the solar cell to determine the thermal exchange rating. At 506, an environmental impact metric is generated (e.g., using controller 120). The environmental impact metric may be used to quantitatively assess an environmental impact of the use of solar cell 130 to convert energy from sunlight into electricity. The environmental impact metric is useable to determine an environmental impact rating (e.g., by applying the environmental impact metric to data related to solar cell 130). The environmental impact rating may be based on the power generation rating and the thermal exchange rating. The environmental impact rating provides an indication of an environmental impact of using solar cell 130.

At 508, solar cell design data is generated based on the environmental impact metric. For instance, the solar cell design data may be generated to minimize an environmental impact of solar cell 130. The solar cell design data may also be generated to optimize any of the components of the environmental impact rating, such as the power generation criterion or the thermal exchange criterion as applied to solar cell 130. At 510, solar cell 130 may be provided based on the solar cell design data. For instance, solar cell 130 may be manufactured using the dimensions and materials specified by the solar cell design data.

Figure 6:
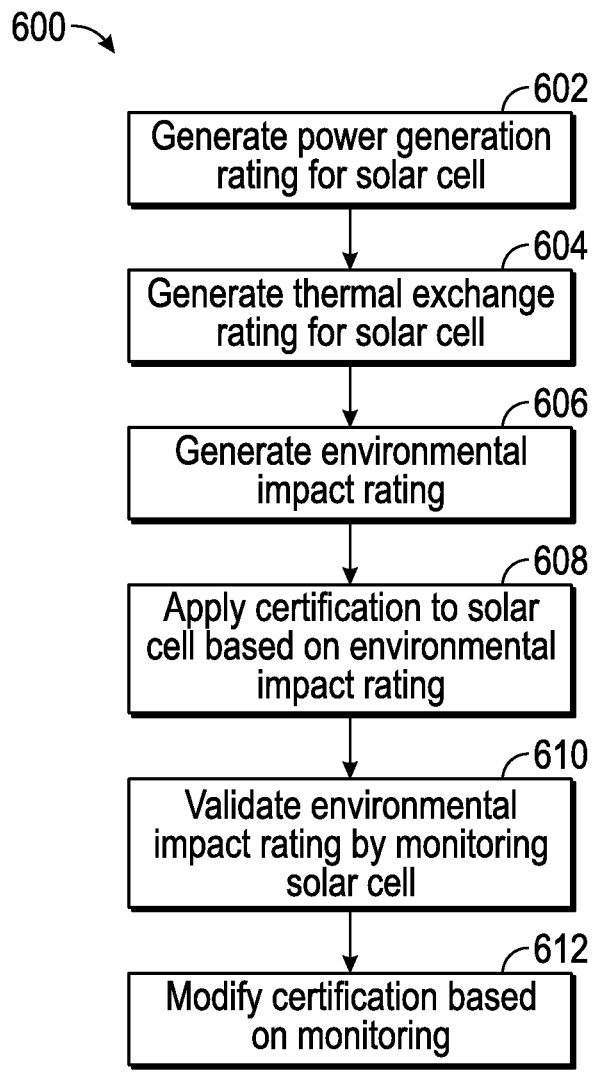
FIG. 6 is a flow chart diagram of a process for determining an environmental impact rating for a solar cell, according to one embodiment.

Referring now to FIG. 6, flow chart 600 shows a process for providing an environmental impact rating for a solar cell (e.g., solar cell 130), according to one embodiment. The process may be at least partially performed using controller 120. At 602, a power generation rating is generated (e.g., by applying a power generation metric to power generation data regarding solar cell 130). At 604, a thermal exchange rating is generated (e.g., by applying a thermal exchange metric to thermal exchange data regarding solar cell 130). The power generation data and the thermal exchange data may be received from data acquisition device 110. At 606, an environmental impact rating is generated (e.g., based on the power generation rating and the thermal exchange rating). The environmental impact rating may also be based on the power generation data and the thermal exchange data. At 608, a certification (e.g., certification 134) may be applied to solar cell 130 based on the environmental impact rating. The certification may be a sticker, a stamp, or another marking intended to provide a visual indication of the environmental impact rating. The certification may be applied by controller 120 (e.g., by a machine controlled by controller 120). At 610, the environmental impact rating may be validated by monitoring one or more characteristics of solar cell 130 in use (e.g., using sensor assembly 136). For instance, sensor assembly 136 may monitor whether any estimated or provided solar cell data is accurate. Sensor assembly 136 may also monitor an energy efficiency of solar cell 130, a thermal exchange rate of solar cell 130, or any other data incorporated as part of the environmental impact rating. At 612, the certification may be modified based on the monitored characteristics or data regarding solar cell 130. For instance, the certification may be removed and replaced, or the certification may be changeable (e.g., by controller 120) to reflect a corrected environmental impact rating.

The construction and arrangement of the apparatus, systems and methods as shown in the various embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, some elements shown as integrally formed may be constructed from multiple parts or elements, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the described embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another. Such joining may be communicative, rather than physical.

Although the figures may show or the description may provide a specific order of method steps, the order of the steps may differ from what is depicted. Also two or more steps may be performed concurrently or with partial concurrence. Such variation will depend on various factors, including software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method for providing an environmental impact rating for a solar cell, comprising:
    acquiring power generation data and thermal exchange data regarding the solar cell using a data acquisition device;
    transmitting the power generation data and the thermal exchange data to a controller;
    generating a power generation metric based on the power generation data, using the controller, wherein the power generation metric is useable to determine a power generation rating for the solar cell;
    generating a thermal exchange metric based on the thermal exchange data, using the controller, wherein the thermal exchange metric is useable to determine a thermal exchange rating for the solar cell;
    generating an environmental impact metric, using the controller, wherein the environmental impact metric is useable to determine an environmental impact rating for the solar cell and the environmental impact rating is based on the power generation rating and the thermal exchange rating, and wherein the environmental impact rating provides an indication of an environmental impact of using the solar cell.

2. The method of claim 1, wherein the solar cell comprises a solar concentrator, and wherein the power generation rating and the thermal exchange rating are based on one or more properties of the solar concentrator.

3. The method of claim 1, wherein the power generation rating and the thermal exchange rating are based on the same designated time period.

4. The method of claim 1, further comprising:
    determining an energy efficiency of the solar cell based on the power generation data;
    wherein the power generation rating is based on the energy efficiency.

5. The method of claim 1, further comprising:
    determining a power production of the solar cell based on the power generation data;
    wherein the power generation rating is based on the power production.

6. The method of claim 5, wherein the power production is determined based on at least one of a peak power production for the solar cell and an average power production for the solar cell over a designated time period.

7. The method of claim 1, wherein the thermal exchange rating is based on a difference between net warming of the solar cell and net warming of a surface to be occluded by the solar cell.

8. The method of claim 7, wherein each of the net warmings are based on a difference between absorbed solar irradiation and thermal radiation.

9. The method of claim 1, further comprising:
    determining a heat transfer coefficient of the solar cell based on the thermal exchange data;
    wherein the thermal exchange rating is generated based on the heat transfer coefficient.

10. The method of claim 1, wherein the environmental impact rating is a relative rating generated relative to an alternative means of energy production.

11. The method of claim 1, further comprising:
    applying a certification to the solar cell based on the environmental impact rating;

wherein the certification provides a visual indication of the environmental impact rating.

12. The method of claim 11, further comprising:
providing a sensor assembly coupled to the solar cell;
validating the environmental impact rating by monitoring the solar cell after the certification is applied using the sensor assembly; and
modifying the certification based on a signal received from the sensor assembly using the controller.

13. The method of claim 1, further comprising:
generating solar cell design data, using the controller, based on the environmental impact metric.

14. A system for providing an environmental impact rating for a solar cell, the system comprising:
a sensor assembly configured to monitor and collect data related to an energy efficiency and a thermal exchange rate of the solar cell;
a data acquisition device configured to acquire power generation data and thermal exchange data regarding the solar cell from the sensor assembly; and
a controller coupled to the data acquisition device and configured to provide the environmental impact rating based on the power generation data and the thermal exchange data,
wherein the environmental impact rating provides an indication of an environmental impact of using the solar cell,
wherein the controller is configured to provide a power generation rating for the solar cell based on the power generation data and provide a thermal exchange rating for the solar cell based on the thermal exchange data, and
wherein the environmental impact rating is based on the power generation rating and the thermal exchange rating.

15. The system of claim 14, wherein the solar cell comprises a solar concentrator, and wherein the power generation rating and the thermal exchange rating are based on one or more properties of the solar concentrator.

16. The system of claim 14, wherein the thermal exchange rating is based on a difference between net warming of the solar cell and net warming of a surface to be occluded by the solar cell.

17. The system of claim 16, wherein each of the net warmings are based on a difference between absorbed solar irradiation and thermal radiation.

18. The system of claim 14, wherein the power generation rating and the thermal exchange rating are based on the same designated time period.

19. The system of claim 14, wherein the controller is configured to provide an energy efficiency of the solar cell based on the power generation data, and wherein the power generation rating is based on the energy efficiency.

20. The system of claim 14, wherein the controller is configured to provide a power production of the solar cell based on the power generation data, and wherein the power generation rating is based on the power production.

21. The system of claim 20, wherein the power production is based on at least one of a peak power production for the solar cell and an average power production for the solar cell over a designated time period.

22. The system of claim 14, wherein the controller is configured to provide a heat transfer coefficient of the solar cell based on the thermal exchange data, and wherein the thermal exchange rating is based on the heat transfer coefficient.

23. The system of claim 14, wherein the environmental impact rating is a relative rating and the controller is configured to generate the environmental impact rating relative to an alternative means of energy production.

24. The system of claim 14, wherein the controller is configured to generate a certification for the solar cell based on the environmental impact rating, and wherein the certification is configured to provide a visual indication of the environmental impact rating.

25. The system of claim 24, further comprising:
a sensor assembly configured to monitor a characteristic of the solar cell;
wherein the controller is coupled to the sensor assembly and configured to:
validate the environmental impact rating based on a signal received from the sensor assembly; and
modify the certification based on the signal.

26. The system of claim 14, wherein the controller is further configured to provide solar cell design data based on the environmental impact rating.

27. The system of claim 14, further comprising a solar cell, wherein the solar cell comprises the sensor assembly.

28. A method for providing solar cell design data for a solar cell, comprising:
generating a power generation metric based on a selected power generation criterion, using a controller, wherein the power generation metric is useable to determine a power generation rating for the solar cell;
generating a thermal exchange metric based on a selected thermal exchange criterion, using the controller, wherein the thermal exchange metric is useable to determine a thermal exchange rating for the solar cell;
generating an environmental impact metric, using the controller, wherein the environmental impact metric is useable to determine an environmental impact rating for the solar cell and the environmental impact rating is based on the power generation rating and the thermal exchange rating, and wherein the environmental impact rating provides an indication of an environmental impact of using the solar cell; and
generating solar cell design data, using the controller, based on the environmental impact metric.

29. The method of claim 28, wherein the solar cell comprises a solar concentrator, and wherein the power generation rating and the thermal exchange rating are based on one or more properties of the solar concentrator.

30. The method of claim 28, wherein the thermal exchange metric is based on a difference between net warming of the solar cell and net warming of a surface to be occluded by the solar cell.

31. The method of claim 28, wherein the solar cell includes a coating for reflecting light, and wherein the solar cell design data includes a characteristic of the coating.

32. The method of claim 28, wherein the solar cell design data is generated such that the environmental impact of the solar cell is below a predetermined limit, as measured by the environmental impact rating.

33. The method of claim 28, further comprising:
providing the solar cell based on the solar cell design data.

34. The method of claim 28, wherein at least one of the power generation metric and the thermal exchange metric is based on a comparison to an alternative means of energy production.

35. The method of claim 28, wherein the power generation metric is based on a manufacturing cost associated with the solar cell and a solar cell lifetime.

36. The method of claim 28, wherein the solar cell design data is generated based on an intended location for the solar cell.

\* \* \* \* \*